(12) United States Patent
Otto et al.

(10) Patent No.: US 10,148,054 B2
(45) Date of Patent: Dec. 4, 2018

(54) METHOD FOR SOLDERLESS ELECTRICAL PRESS-IN CONTACTING OF ELECTRICALLY CONDUCTIVE PRESS-IN PINS IN CIRCUIT BOARDS

(71) Applicant: Robert Bosch GmbH, Stuttgart (DE)

(72) Inventors: Andreas Otto, Hoerselberg-Hainich (DE); Cynthia Halm, Eisenach (DE)

(73) Assignee: Robert Bosch GmbH, Stuttgart (DE)

( * ) Notice: Subject to any disclaimer, the term of this patent is extended or adjusted under 35 U.S.C. 154(b) by 156 days.

(21) Appl. No.: 15/509,570

(22) PCT Filed: Jun. 19, 2015

(86) PCT No.: PCT/EP2015/063799
§ 371 (c)(1),
(2) Date: Mar. 8, 2017

(87) PCT Pub. No.: WO2016/037716
PCT Pub. Date: Mar. 17, 2016

(65) Prior Publication Data
US 2017/0256902 A1    Sep. 7, 2017

(30) Foreign Application Priority Data
Sep. 8, 2014    (DE) .................. 10 2014 217 927

(51) Int. Cl.
*H01R 12/58*    (2011.01)
*H01R 43/20*    (2006.01)
*H05K 3/32*    (2006.01)

(52) U.S. Cl.
CPC ......... *H01R 43/205* (2013.01); *H01R 12/585* (2013.01); *H05K 3/328* (2013.01);
(Continued)

(58) Field of Classification Search
CPC . H05K 2201/10189; H05K 2203/0285; H05K 2203/0195; H01R 43/205; H01R 9/092
See application file for complete search history.

(56) References Cited

U.S. PATENT DOCUMENTS 5,509,192 A * 4/1996 Ota ...................... H01R 43/205
29/703
2002/0195271 A1    12/2002 Gailus

FOREIGN PATENT DOCUMENTS

DE    4242837 A1    6/1994
DE    10052613 A1    5/2002
(Continued)

OTHER PUBLICATIONS

International Search Report for PCT/EP2015/063799, dated Sep. 11, 2015.

*Primary Examiner* — Livius Radu Cazan
(74) *Attorney, Agent, or Firm* — Norton Rose Fulbright US LLP; Gerard Messina

(57) ABSTRACT

A method is described for solderless electrical press-in contacting of conductive press-in pins in circuit boards, the method comprising the following steps: Providing a circuit board having at least one contacting opening for press-in contacting; providing at least one press-in component having at least one conductive press-in pin; providing a sonotrode for exerting a force and for applying ultrasonic energy. In order to electrically and mechanically contact press-in pins to a circuit board by means of ultrasonic press-in technology, it is provided that the press-in component together with its press-in pin, is fixated during a press-in step, in particular held firmly in place, and that a force and ultrasonic energy are directly applied to the circuit board by means of the sonotrode such that the circuit board is pressed (Continued)

at the location of its contacting opening onto the press-in pin, not directly acted upon by the sonotrode, of the press-in component.

16 Claims, 4 Drawing Sheets

(52) U.S. Cl.
CPC ............ *H05K 2201/10189* (2013.01); *H05K 2201/10303* (2013.01); *H05K 2203/0195* (2013.01); *H05K 2203/0278* (2013.01); *H05K 2203/0285* (2013.01)

(56) References Cited

FOREIGN PATENT DOCUMENTS

| | | |
|---|---|---|
| DE | 10222200 A1 | 11/2003 |
| JP | H01300599 A | 12/1989 |

\* cited by examiner

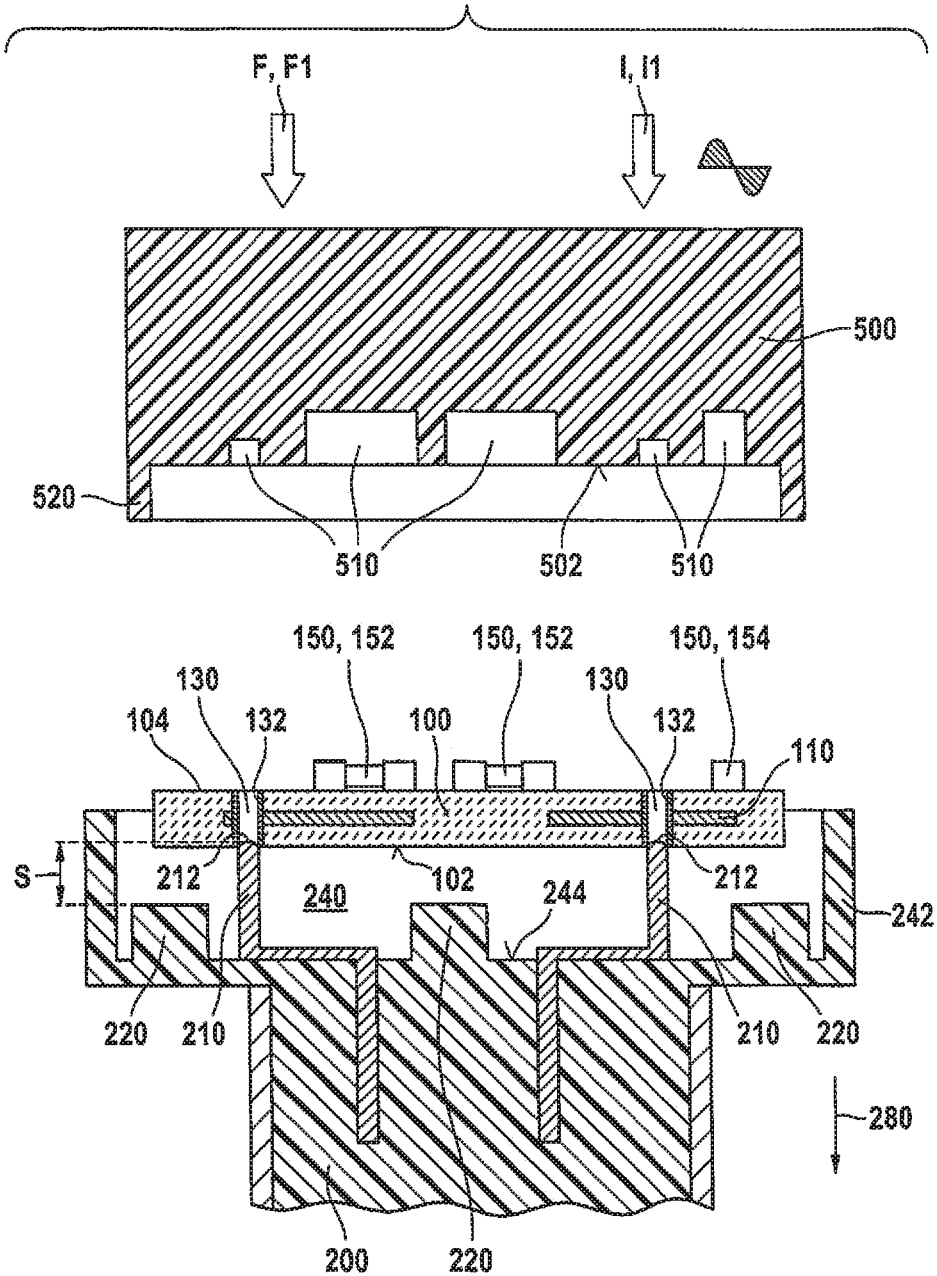

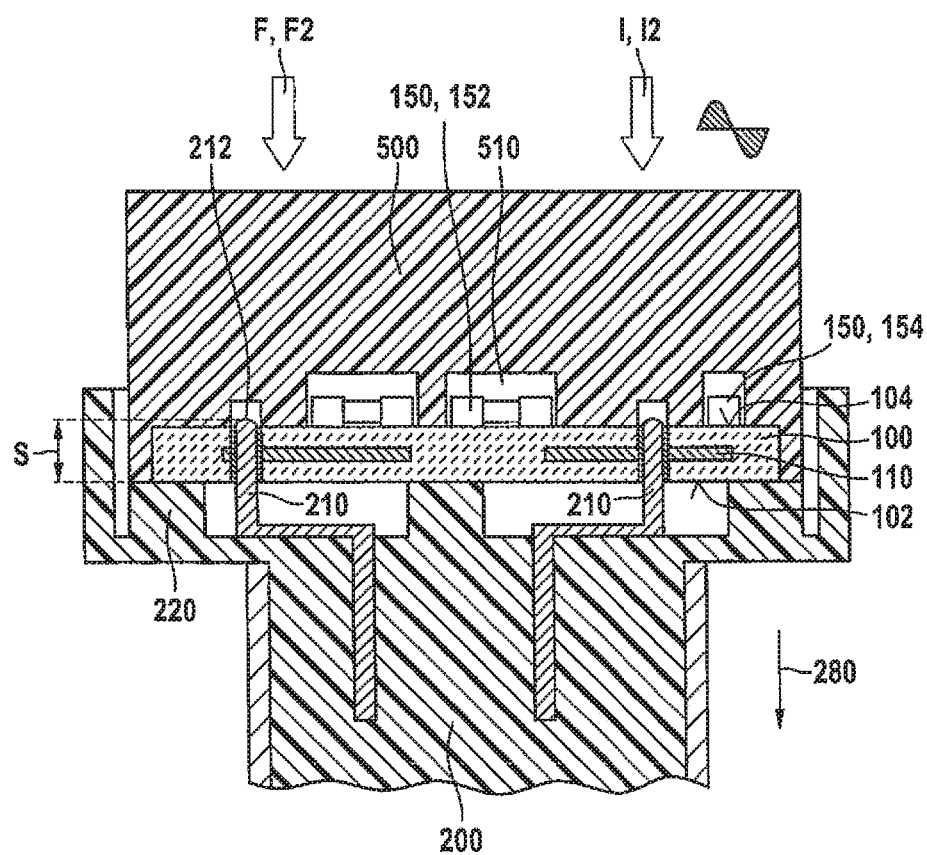

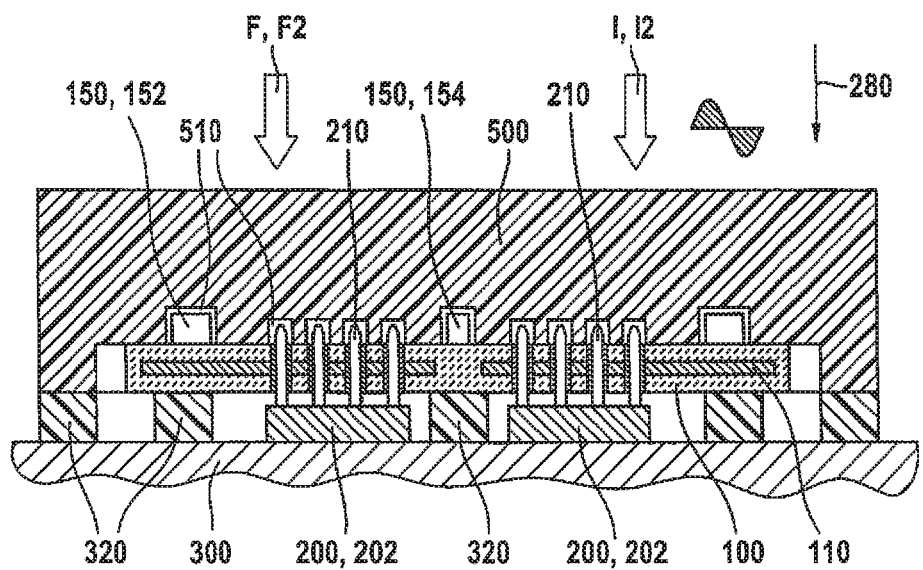
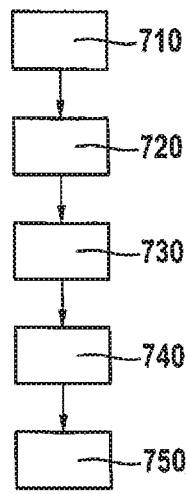

METHOD FOR SOLDERLESS ELECTRICAL PRESS-IN CONTACTING OF ELECTRICALLY CONDUCTIVE PRESS-IN PINS IN CIRCUIT BOARDS

FIELD OF THE INVENTION

The present invention relates to a method for solderless electrical press-in contacting of electrically conductive press-in pins in circuit boards.

BACKGROUND INFORMATION

The term "cold contacting technology" subsumes the group of inseparable non-positive and positive electrical contacts. All variants share the common feature that the electrical contact is established solely by press-fitting or by clamping the joining partners.

Press-in connections for the direct contacting of circuit boards are used in numerous products. The multitude of variants ranges from single press-in pins in on-board computers to edge connectors with up to several hundred press-in pins in control units. If a large number of press-in pins is to be pressed in, there will be greater demands on the accuracy of the clearances and the orientation of the press-in pins among each other, the contacting openings in the circuit board as well as the positioning of the press-in pins prior to and during the compression process in relation to the contacting openings.

The single press-in pins are typically pressed into a circuit carrier. This requires high forces (approximately 100-300 Newton per pin depending on the number of pins), high accuracy as well as off-limit zones in order to minimize damage to adjacent structures. Ultrasonic augmentation when the pins are pressed into the circuit board results in an improvement of the above-mentioned points.

From German Published Patent Application No. 42 42 837 A1, a method is known for pressing metallic elements into circuit boards.

SUMMARY

The present invention is based on the understanding that the contacting opening in the circuit board can be damaged quite easily when solid press-in pins are pressed in In addition, the use of solid press-in pins requires very tight manufacturing tolerances. In the case of flexible press-in pins that can be compressed in an elastically reversible manner transversely to the press-in direction, the spring geometry of the press-in pins limits the material selection.

The use of ultrasound during the press-in operation makes it possible to markedly reduce the risk of damage to the contacting opening. However, the press-in process of the press-in pins in the circuit board is very time-consuming in conventional methods because the press-in process is carried out one after the other for each pin, or in other words, in a sequential manner. In addition, components that have a plurality of contact pins (such as integrated switching circuits, sensors in a SOIC housing, for example, etc.) are not always suitable for press-in fitting with the aid of ultrasound press-in technology, or at least not always readily.

Therefore, there may exist a need to provide a method that makes it possible to press a multitude of press-in pins into a circuit board at the same time using cold contacting technology augmented with ultrasound. In particular, there may be a need for fitting a circuit board that is already assembled virtually completely with components, with one or more components within the shortest time interval possible using ultrasound-augmented cold contacting technology, the one or multiple components having at least one press-in pin or a plurality of press-in pins.

In the following text, features, details and possible advantages of a method for solderless electrical press-in contacting of electrically conductive press-in pins in circuit boards according to specific embodiments of the present invention will be described in detail.

According to a first aspect of the present invention, a method for solderless electrical press-in contacting of electrically conductive press-in pins in circuit boards is provided. This method allows for simultaneous fitting of the circuit board with one or more press-in component(s). The respective press-in component(s) has/have at least one press-in pin and preferably, a plurality of press-in pins.

This is achieved by the method having the following steps: Providing a circuit board that has at least one contacting opening for the press-in contacting, which is routed essentially perpendicularly through the circuit board. Providing at least one press-in component having at least one electrically conductive press-in pin. Providing a sonotrode for exerting a force and for applying ultrasonic energy. In this context it is provided that the at least one press-in component with its at least one press-in pin is fixated during a press-in step, in particular is held firmly in place; and it is provided that during the press-in step the sonotrode applies a force (F) and applies ultrasonic energy (I) directly on the circuit board, in such a way that the circuit board is pressed at the location of its at least one contacting opening onto the at least one press-in pin, not directly acted upon by the sonotrode, of the at least one press-in component.

In comparison with the related art, the method according to the present invention offers the advantage that it allows for the simultaneous, and thus particularly time-saving, pressing-in of a large number of press-in components or a large number of press-in pins into the circuit board. The use of ultrasound-augmented cold contacting technology makes it possible to obtain a connection that is high in strength in comparison to conventional methods, i.e. an integral connection, employing cold soldering. In an advantageous manner, the contact partners (circuit board and press-in component) are not subjected to thermal stressing (by the friction process of ultrasound) or merely to low thermal stressing, or only to localized thermal stressing at the contact point between press-in pin and the contacting opening.

In addition, the proposed method makes it possible to use the ultrasound-augmented cold contacting technology also for press-in pins that are fixedly disposed in a carrier, the carrier being a plug-connector, for example, onto which the circuit board is pressed for the contacting. Within the meaning of the present application, such a carrier with its at least one press-in pin may be considered a press-in component. In an advantageous manner, the proposed method makes it possible to reduce constructive tolerance chains in comparison with the related art (e.g. for the ascertainment of minimum clearances between components), which allows for closer component fitting of the circuit board with press-in components. In the same way it is advantageously possible to increase the manufacturing tolerances for the production of the press-in pins so that a lower reject rate is achievable and the costs are able to be reduced considerably.

With the aid of the proposed method, it is advantageously also possible to dispense with complex tools for the ultrasound coupling because the sonotrode engages directly at the circuit board. Finally, the proposed method is essentially independent of the number of the press-in pins to be pressed into the circuit board.

In an advantageous manner, the proposed method also makes it possible to dispense with elastic press-in pins so that a considerably greater material selection is available for the material of the at least one press-in pin. It should be noted that the method naturally also works when elastic press-in pins are used.

These advantages are obtained in that the at least one press-in component is fixated during the press-in step, or in other words, is kept firmly in place and is not subjected to any direct application of ultrasound. In particular, the sonotrode does not engage at the at least one press-in component. By placing the circuit board on top of the at least one press-in pin of the at least one press-in component and by applying a force (the press-in force) and ultrasonic energy with the aid of the sonotrode directly to the circuit board, only one joining partner, i.e. the circuit board, must be brought into contact with the sonotrode. The single-step pressing-in operation of all press-in pins brought into contact with the circuit board is thereby able to be accomplished in an uncomplicated manner. During the force- and ultrasound-application process, the sonotrode may be (temporarily) firmly connected to the circuit board, e.g. with the aid of a vacuum, a temporary screw connection or magnetic mounting, for example.

In other words, in contrast to conventional methods, it is not the case that each individual pin is pressed into the circuit board with the aid of ultrasound. Instead, the sonotrode applies ultrasonic energy and force to the circuit board and the circuit board is thereby pressed onto the at least one held press-in pin in a single step. This advantageously also makes it possible to press-fit components such as integrated circuits or sensors in the form of SOIC housings, for example, with the circuit board. In general, components that include press-in pins that have already been extrusion-coated with plastic in a housing, for instance, are able to be press-fitted with the circuit board. The circuit board can also be pressed onto plug connectors with solid pins; in this case, the pins have already been mounted inside a housing of the plug connector, e.g., extrusion-coated by plastic, prior to the press-in operation.

It may happen in these methods that the at least one press-in pin is subjected to an ultrasonic excitation as well. However, this ultrasonic excitation is due merely to the contact between the press-in pin and the circuit board acted upon by ultrasound. In such a scenario the press-in pin thus simply oscillates along in a passive manner. A direct excitation of the press-in pins by ultrasonic energy via a sonotrode is not envisioned.

The circuit board may be a rigid circuit board made from an FR4 material or better. The circuit board may also be a ceramic circuit board. The circuit board may be provided with at least one electrically conductive circuit trace on its surface or in its interior. The contacting opening of the circuit board is able to be developed as an electrically conductive sleeve, such as a sleeve pressed into the circuit board. The contacting opening can also be developed in the form of a bore routed through the circuit board, which has an electrically conductive coating such as a metal coating on its inner wall, for example. For instance, the contacting opening may thus be completely metallized on its inner wall. The contacting opening may have an essentially round cross-section, but other cross-sections such as oval, rectangular or elongated-hole cross-sections are possible too.

The sonotrode is able to apply ultrasound having frequencies of up to 70 kHz or also up to 140 kHz to the circuit board. The amplitude of the ultrasound vibration may lie in the micrometer range. For example, the amplitude of the ultrasound vibration may amount to up to 10 µm or up to 20µ, and preferably up to 50 µm and especially preferably, up to 100 µm. With respect to the press-in pin, the ultrasound vibrations may be longitudinal and/or transverse ultrasound vibrations. The ultrasonic energy depends on the frequency and the amplitude of the ultrasound vibration, among other things.

The at least one press-in pin may have a square or rectangular or triangular or round or oval cross-section transversely to its longitudinal axis, for example.

According to one specific embodiment of the present invention, it is provided that the circuit board has already been fitted with components prior to the press-in step, and in particular, that the fitting of components on the circuit board has been completely finished except for the press-in step for the fitting with the at least one press-in component. This advantageously allows the fully assembled circuit board to be pressed onto press-in pins of a plug connector, for example, thereby making it possible to fully assemble a control unit without thermal stressing, for instance. In addition, for example, this advantageously makes it possible to first mount components that are not sensitive with regard to thermal stressing on the circuit board using a soldering process or a bonding process; subsequently, temperature-sensitive components are able to be electrically and mechanically connected to the circuit board in a single step and thus in a very time-saving manner, using the ultrasound-augmented press-in technology. The advantages of the respective methods are thereby able to be utilized without the press-in method taking up too much time.

According to one specific embodiment of the present invention, the sonotrode is provided with recesses on a side facing the circuit board; the recesses are at the particular locations that lie opposite from the locations on the side of the circuit board fitted with components and facing the sonotrode during the press-in step. This has the advantageous effect that the sonotrode will not cause damage to the components already situated on the circuit board. In an especially advantageous manner, the sonotrode is thereby able to establish direct contact with a surface of the circuit board since the locations of the circuit board that accommodate components are left free in the sonotrode. This achieves an especially efficient in-coupling of the ultrasonic energy into the circuit board.

According to one specific embodiment of the present invention, the circuit board has a first side facing the at least one press-in component, and a second side pointing away from the first side. The sonotrode is placed on the second side during the press-in step. The sonotrode may cover at least 50% of the area of the second side, and especially preferably, the sonotrode covers at least 75% of the area of the second side and very especially preferably, at least 90% of the area of the second side. This advantageously makes it possible that the force for the press-in step and the ultrasonic energy for the press-in step are applied to the circuit board, or coupled into the circuit board, in the most planar and uniform manner possible. This results in especially low loading of the circuit board, or of components already mounted on the circuit board, during the press-in step (a deformation of the circuit board can thereby be kept to a minimum, for instance, or a high pointwise ultrasonic load is also able to be avoided). In this way a particularly homogeneous connection is advantageously achieved between the at least one press-in pin and the circuit board.

According to one specific embodiment of the present invention, the sonotrode presses the circuit board onto the at least one press-in pin along the extension direction of the at least one contacting opening, across a distance S, during the press-in step. In so doing, a first force (F1) and a first ultrasonic energy (I1) are applied to the sonotrode along distance S during the press-in operation. This advantageously allows for an especially precise adjustment of the press-in depth. The press-in depth is represented by distance S. In this context, distance S starts at a first point of contact between the circuit board and the at least one press-in pin.

According to one specific embodiment of the present invention, it is provided that once distance S has been covered, the sonotrode exerts a second force (F2) on the circuit board, the second force (F2) being very low in comparison with the first force (F1), and second force (F2) amounting to maximally 10% of first force (F1), in particular. In addition, once distance S has been covered, the sonotrode applies a second ultrasonic energy (I2) on the circuit board, the second ultrasonic energy (I2) being greater than the first ultrasonic energy (I1), and greater by at least 25% than the first ultrasonic energy (I1), in particular. Second force (F2) may amount to approximately zero. First ultrasonic energy (I1) may be zero or approximately zero. This has the advantageous result that in the actual pressing-on operation, which extends along distance S, the pressing-on takes place essentially through the application of first force (F1). In this part of the press-in step, the ultrasonic energy, i.e. first ultrasonic energy (I1), may be used, above all, for facilitating or accelerating the press-on process. This is done in that the ultrasound application creates or facilitates a sliding process during the press-on process (the ultrasonic energy prevents catching or tilting of the press-in pin in the contacting opening). After distance S has been covered, friction welding between the at least one press-in pin and the circuit board is able to be induced by increasing the ultrasonic energy, in particular by increasing the ultrasonic energy considerably, to second ultrasonic energy (I2). This allows for an integral connection between the at least one press-in pin and the circuit board. Such an integral connection (e.g. a friction-welded connection) has greater holding power than a purely positive-engagement or non-positive connection and may therefore be more robust than a connection that results from a pure press-on process.

As an alternative, the second ultrasonic energy (I2) may be less than the first ultrasonic energy (I1), especially lower than the first ultrasonic energy (I1) by at least 25%. In addition, the second ultrasonic energy (I2) may be equal to the first ultrasonic energy (I1) in a further alternative.

The fact that the at least one press-in pin is made of a material that includes metal or a metal alloy from the group of aluminum or copper or iron advantageously allows for the use of especially cost-effective materials. In an advantageous manner, the use of such materials makes it especially easy to create an integral connection between the at least one press-in pin and the circuit board, or the inner wall of the contacting opening of the circuit board, with the aid of the ultrasound application. In an especially advantageous manner, such materials allow for the creation of a particularly strong integral connection between the at least one press-in pin and the circuit board, thereby increasing the holding power of the at least one press-in pin in the circuit board to an especially great extent in comparison with conventional press-in pins. This may advantageously result in a particularly high mechanical load-carrying capacity of the connection between the circuit board and the press-in component-connection.

Since the at least one press-in pin is produced as a solid pin, in particular without a cavity and without flexible sections, it is advantageously the case that the at least one press-in pin, and thus the press-in component including the at least one press-in pin, is able to be produced especially cost-effectively. In a particularly advantageous manner, this also allows for the use of materials for the production of the at least one press-in pin that do not have any particularly outstanding elastic properties. Copper-iron alloys may be used in an especially advantageous manner. As a whole, this advantageously increases the design freedom in the selection and production of the press-in pins.

According to one specific embodiment of the present invention, a plurality of press-in pins, in particular at least two press-in pins and preferably at least four press-in pins, are provided on the at least one component. A circuit board is provided, which has a number of contacting openings that correspond at least to the number of press-in pins of the at least one component. In other words, at least one contacting opening is provided for each press-in pin in the circuit board. This advantageously makes it possible to electrically and mechanically connect the press-in component or the multitude of press-in pins to the circuit board in a single step and in an especially time-saving manner.

BRIEF DESCRIPTION OF THE DRAWINGS

FIG. 1a shows a cross-section through a first specific embodiment of a system for executing the method of the present invention, prior to the press-in step.

FIG. 1b shows the system from FIG. 1a, following the press-in step.

FIG. 2b shows the system from FIG. 2a following the press-in step.

FIG. 3 shows a specific embodiment of the method according to the present invention.

DETAILED DESCRIPTION

Figure 2A:
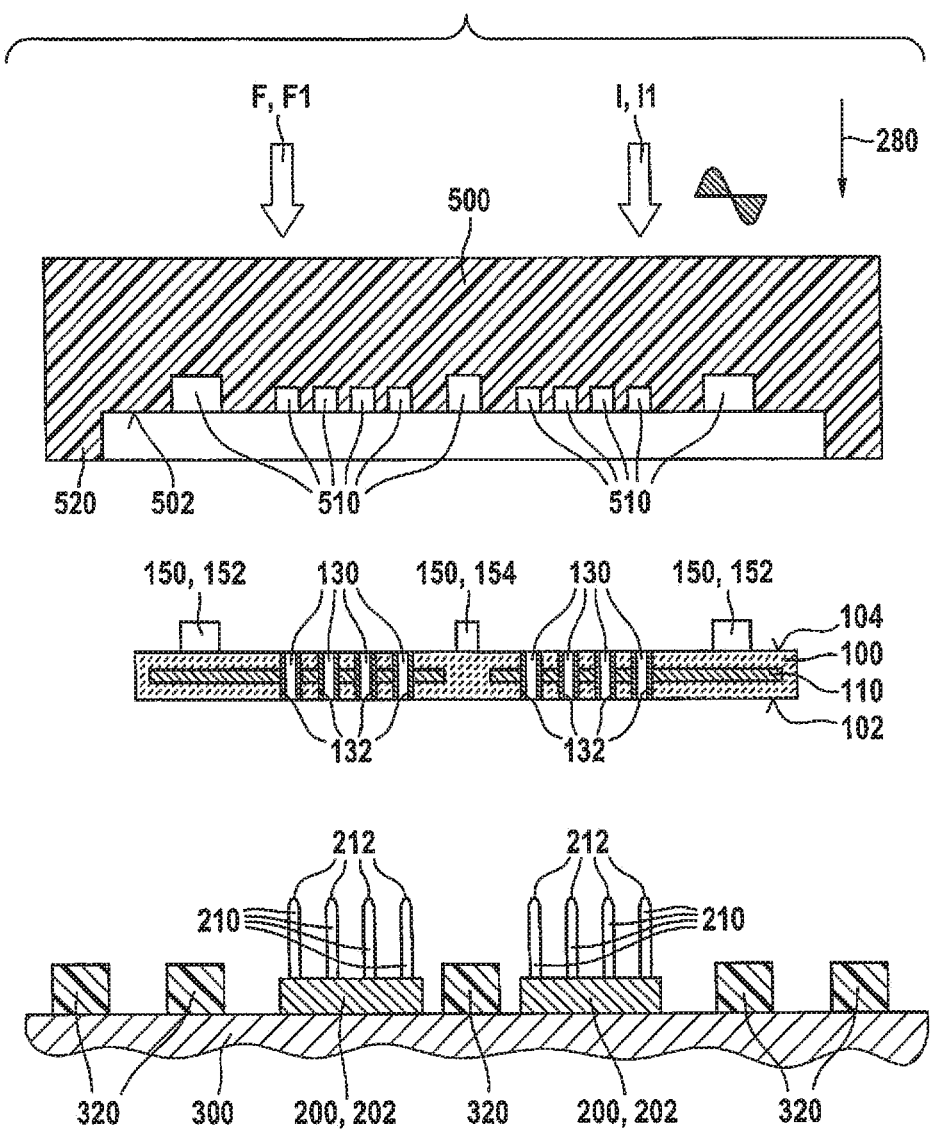
FIG. 2a shows a cross-section through a second specific embodiment of a system for executing the method of the present invention, prior to the press-in step.

All of the figures are merely schematic representations of the method of the present invention or of steps of the present method or of arrangements in various steps of the method according to exemplary embodiments of the present invention. Clearances and proportions are especially not represented true to scale in the figures. Corresponding elements in the various figures have been provided with the same reference numerals.

FIG. 1a shows a system for executing the method of the present invention. The system in FIG. 1a illustrates the present method in the step prior to the press-in step. In order to execute the present method for solderless electrical press-in contacting of electrically conductive press-in pins 210 in circuit boards 100, a circuit board 100, a sonotrode 500 for exerting a force and for applying ultrasonic energy, as well as a press-in component 200 having two press-in pins 210, which are visible in this cross-section, are provided.

Circuit board 100 is disposed between press-in component 200 and sonotrode 500.

Circuit board 100 may be developed from FR4 material or better, or as a ceramics circuit board. The circuit board has a first side 102, which faces press-in component 200. In addition, circuit board 100 has a second side 104, which points away from first side 102. Second side 104 is facing sonotrode 500.

Circuit board 100 has at least one circuit trace 110, which is situated within circuit board 100 in the exemplary embodiment shown. It is also quite easily possible to place the at least one circuit trace 110 on one of surfaces 102, 104 of circuit board 100. Circuit board 100 has contacting openings 130 that reach through or penetrate circuit board 100. Contacting openings 130 may be connected to circuit trace 110 in an electrically conductive manner. Contacting openings 130 may have a metallic coating on their inner walls 132; preferably, inner walls 132 of contacting openings 130 are metallized completely. Circuit board 100 may be fitted with electrical and/or electronic components 150 which are mounted on circuit board 100. For example, electrical and/or electronic components 150 may be passive components 152 such as capacitors or resistances but also integrated circuits such as an application-specific integrated circuit (ASIC) 154. These components 150 are able to be mounted on circuit board 100 with the aid of a soldering process or a bonding process, for example.

Press-in component 200 has press-in pins 210, which are facing toward circuit board 100, of which two can be seen in the illustrated cross-sectional view. Press-in pins 210 have free ends 212 facing circuit board 100, which are in alignment with contacting openings 130 of circuit board 100. Press-in component 200 is firmly fixed in place, the holding mechanism for fixating the press-in component not being shown in the figure. Press-in component 200 is developed as a type of plug housing in the exemplary embodiment shown, in which press-in pins 210 are fastened in a plastic-extruded manner, for example. On the side facing circuit board 100, press-in component 200 is designed in the shape of a cup and a circumferentially extending outer wall 242, for instance, delimits an interior 240 of the cup shape. Press-in pins 210 are disposed in interior 240 of the cup shape. Spacer pieces 220 or bearing elements 220 on which circuit board 100 is able to make contact when pressed onto press-in pins 210 (FIG. 1b), are disposed in interior 240 of the cup shape on a bottom 244 of the cup shape. Via their free ends 212, press-in pins 210 project along a press-on direction 280 beyond bearing elements 220 by a distance S.

On its side facing circuit board 100, sonotrode 500 is provided with a bearing surface 502 which is suitable to be placed directly on second side 104 of circuit board 100. On its outer side, sonotrode 500 includes a collar-shaped outer wall 520, which delimits circuit board 100 when sonotrode 500 sets down on circuit board 100. Located on the side of the sonotrode that faces circuit board 100 are recesses 510 in bearing surface 502. Recesses 510 are provided at the particular locations that come to lie above the respective locations of circuit board 100 in which components 150 are situated on circuit board 100 when sonotrode 500 is placed on circuit board 100. In this way it is ensured that sonotrode 500 comes into direct contact, by way of its contact area 502, with second side 104 of the circuit board in all locations, that is to say, without touching an already mounted component 150 along press-on direction 280 and without therefore applying direct ultrasound to such a component. Means (not shown here) for connecting sonotrode 500 to circuit board 100 during the press-in step are provided on sonotrode 500. For example, sonotrode 500 may aspirate circuit board 100 by means of a vacuum at its bearing surface 502. It is also possible to screw sonotrode 500 to circuit board 100 for the press-in step or to temporarily firmly connect it to circuit board 100 by magnetic force.

In FIG. 1a, the press-in step or the press-on process is shown at an instant at which circuit board 100 with its contacting openings 130 has been placed onto free ends 212 of contact pins 210 of press-in component 200 and in which sonotrode 500 has not yet been brought into contact with circuit board 100. The method can also be executed in a form that is not shown here, in such a way that circuit board 100 is first attached to sonotrode 500 and circuit board 100, connected to sonotrode 500, is then set down on press-in pins 210. To then press circuit board 100 onto press-in pins 210, sonotrode is pressed against press-in pins 210 using a first force (F1) and a first ultrasonic energy (I1) in press-on direction 280. Press-in component 200 is firmly held in place in the process.

FIG. 1b shows the system from FIG. 1a in the state in which circuit board 100 is pressed on press-in pins 210. Circuit board 100 has been pressed onto press-in pins 210 of press-in component 200 by a distance S. Press-in pins 210 project through circuit board 100. It should be noted that sonotrode 500 also includes recesses 510 for free ends 212 of press-in pins that now project through circuit board 100. Circuit board 100 is resting on bearing elements 220 in the pressed-on state. In this state, that is to say, after circuit board 100 has been pressed onto press-in pins 210 by distance S, the until then essentially positive or nonpositive connection between press-in pins 210 and circuit board 100 may also be augmented by an integral component. To do so, a second fore (F2) is applied to the sonotrode. This second force (F2) may be approximately zero or even equal to zero. In particular, however, the sonotrode is acted upon by a second ultrasonic energy (I2), and the second ultrasonic energy (I2) is greater than the first ultrasonic energy (I1). Second ultrasonic energy (I2) may be considerably greater than first ultrasonic energy (I1), e.g., greater by at least 25%, and preferably greater by at least 50%. The amplitude and/or the frequency of the ultrasonic vibration may be increased for this purpose. Circuit board 100, induced to vibrations because of the application of second ultrasonic energy (I2), is now able to enter into a frictional welding connection with the surface of press-in pins 210 by way of the inner walls 132 of its contacting opening 130. Such a connection has an especially high holding power, an especially high electrical reliability and especially low electrical transition resistances. As described earlier, however, second ultrasonic energy (I2) may also be equal to first ultrasonic energy (I1) but second ultrasonic energy (I2) may also be lower than first ultrasonic energy (I1), for instance lower by at least 25%. At the same energy as first ultrasonic energy (I1), for instance, second ultrasonic energy (I2) may also differ from first ultrasonic energy (I1) by parameters of the ultrasonic vibration, e.g. by another frequency at a simultaneous other amplitude.

In FIGS. 2a and 2b, the method according to the present invention is shown analogously to FIGS. 1a and 1b. In contrast to FIGS. 1a and 1b, press-in component 200 is not developed as a type of plug connector or plug. Instead, a plurality of spacers 320 or bearing elements 320 are disposed on a carrier 300. Situated between bearing elements 320 are press-in components 200, such as sensors or integrated switching circuits, for instance in the form of SOIC housings 202 (SOIC=small outline integrated circuit), such that press-in pins 210 of press-in components 200 point away from carrier 300 and face circuit board 100. In accordance with the previous exemplary embodiment, corresponding contact openings 130 for each press-in pin 210 are situated in circuit board 100. In the same way, sonotrode 500, which is able to apply force and ultrasonic energy to circuit board 100, has been provided with recesses 510. Recesses 510 are once again situated at the locations where components 150 are provided on second side 104 of circuit board 100 or also in the particular locations where free ends 212 of press-in pins 200, which project through contacting openings 130 of circuit board after the press-in step, come to lie.

Press-in components 200, 202 are able to be temporarily fixed in place on carrier 300, for instance by vacuum. They may also be fixated on carrier 300 by a mechanical, easily closable and releasable mounting mechanism.

FIG. 2b illustrates the state in which the circuit board is pressed onto press-in pins 210 with the aid of sonotrode 500. In this exemplary embodiment too, an integral connection between contacting openings 130, or inner wall 132 of contacting opening 130, of circuit board 100 and press-in pins 210 is able to be achieved in that circuit board 100 is acted upon by a second ultrasonic energy (I2) by way of sonotrode 500. If sonotrode 500 is then removed and the holding mechanism of press-in components 200 on carrier 300 is released, circuit board 100 is completely fitted with press-in components 200 and may be removed from carrier 300.

In this way circuit boards 100 are able to be fitted with a multitude of press-in components 200, 202 (including an integral connection) in a single step by means of ultrasound-augmented press-in contacting or cold contacting technology, without thermal stressing of circuit board 100 or press-in components 200 to be fitted, as would be the case in reflow soldering, for instance.

FIG. 3 schematically illustrates the method for solderless electrical press-in contacting of electrically conductive press-in pins 210 in circuit boards 100. In a first step 710, a circuit board 100 is provided which has at least one contacting opening 130 that is routed essentially perpendicularly through circuit board 100, contacting opening 130 being suitable for press-in contacting. In a second step 720, a press-in component 200, 202 having at least one electrically conductive press-in pin 210 is provided. In a third step 730, a sonotrode 500 is made available for exerting a force and for applying ultrasonic energy. These three steps 710, 720, 730 may be carried out in a different sequence or at the same time.

Furthermore, following the first three steps, a press-in step 740 is provided. Here, the at least one press-in component 200 including its at least one press-in pin 210 is fixated during press-in step 740, particularly held firmly in place. In addition, in press-in step 740, a force (F), in particular a first force (F1), and an ultrasonic energy (I), in particular a first ultrasonic energy (I1), are applied directly on circuit board 100 with the aid of sonotrode 500, in such a way that circuit board 100 is pressed onto the at least one press-in pin 210, not directly acted upon by sonotrode 500, of the at least one press-in component at the location of its at least one contact opening 130. In other words, ultrasonic energy (I) and force (F) are directly acting only circuit board 100. In press-in step 740, circuit board 100 may be pressed onto the at least one press-in pin 210 by a distance S. After distance S has been covered, a further step 750 may follow press-in step 740; the further step 750 could be viewed as a partial step of press-in step 740 subsequent to press-in step 740. In this further step 750, the sonotrode may exert a second force (F2) on circuit board 100, the second force (F2) being very low in comparison with first force (F1), e.g., amounting to maximally 10% of first force (F1) or even amounting to zero. In addition, sonotrode 500 is able to apply a second ultrasonic energy (I2) to circuit board 100 in the further step 750, second ultrasonic energy (I2) possibly being greater than first ultrasonic energy (I1). In particular, second ultrasonic energy (I2) may be of such magnitude that an integral friction-welded connection is achieved between the circuit board and the at least one press-in pin 201. As an alternative, second ultrasonic energy (I2) may of course also be of the same magnitude as first ultrasonic energy (I1) or it may be lower than first ultrasonic energy (I1).

For example, the method according to the present invention is suitable for use during the manufacture of products for which solderless electrical contacting is necessary in order to minimize the thermal stresses during the manufacturing process, for instance in the case of electrical or electronic control units for motor vehicles, for the contacting of circuit boards for computers, smartphones, tablet PCs and other consumer electronic devices or in the manufacture of network plugs for high-speed data transmissions.

What is claimed is:

1. A method for solderless electrical press-in contacting of at least one electrically conductive press-in pin in a circuit board, comprising:
   providing the circuit board, wherein the circuit board includes at least one contacting opening for a press-in contacting, and wherein the at least one contacting opening is routed essentially perpendicularly through the circuit board;
   providing at least one press-in component having the at least one electrically conductive press-in pin;
   providing a sonotrode for exerting a force and for applying ultrasonic energy; and
   fixating the at least one press-in component having the at least one press-in pin during a press-in step, wherein, in the press-in step, the force and the ultrasonic energy is applied directly to the circuit board with the aid of the sonotrode, in such a way that the circuit board is pressed onto the at least one press-in pin, not directly acted upon by means of the sonotrode, of the at least one press-in component at a location of the at least one contacting opening.

2. The method as recited in claim 1, wherein the at least one press-in component is held firmly in place by the fixating.

3. The method as recited in claim 1, further comprising prior to the press-in step, fitting the circuit board with components, wherein the fitting of components on the circuit board is completely finished except for the press-in step for the fitting with the at least one press-in component.

4. The method as recited in claim 3, wherein the sonotrode includes recesses on a side facing the circuit board at locations that during the press-in step lie opposite from the locations, fitted with the components, of a side of the circuit board facing the sonotrode.

5. The method as recited in claim 1, wherein:
   the circuit board has a first side facing the at least one press-in component, and has a second side facing away from the first side, and
   the sonotrode is set down on the second side during the press-in step.

6. The method as recited in claim 5, wherein the sonotrode covers at least 75% of an area of the second side.

7. The method as recited in claim 1, wherein:
   during the press-in step, the sonotrode presses the circuit board onto the at least one press-in pin along an extension direction of the at least one contacting opening across a distance, and a first force and a first ultrasonic energy are applied to the sonotrode during the press-in step along the distance.

8. The method as recited in claim 7, wherein, after covering the distance:
the sonotrode exerts a second force on the circuit board,
the second force is lower than the first force,
the sonotrode applies a second ultrasonic energy to the circuit board, and
the second ultrasonic energy is one of lower than, equal to, and greater than the first ultrasonic energy.

9. The method as recited in claim 8, wherein the second force amounts to maximally 10% of the first force.

10. The method as recited in claim 8, wherein the second ultrasonic energy is greater by at least 25% than the first ultrasonic energy.

11. The method as recited in claim 8, wherein the second ultrasonic energy is lower by at least 25% than the first ultrasonic energy.

12. The method as recited in claim 1, wherein the at least one press-in pin is made of a material that is one of aluminum, copper, iron, or alloys thereof.

13. The method as recited in claim 1, wherein the at least one press-in pin includes a solid design.

14. The method as recited in claim 13, wherein the at least one press-in pin is one of without a cavity and without a flexible section.

15. The method as recited in claim 1, further comprising providing a plurality of press-in pins on the at least one component, wherein the circuit board includes a number of contacting openings that corresponds to the number of press-in pins of the at least one component.

16. The method as recited in claim 15, wherein the plurality of press-in pins includes at least four press-in pins.

* * * * *